(12) United States Patent
Ghosh et al.

(10) Patent No.: US 10,147,906 B2
(45) Date of Patent: Dec. 4, 2018

(54) HIGH EFFICACY SEAL FOR ORGANIC LIGHT EMITTING DIODE DISPLAYS

(71) Applicant: eMagin Corporation, Hopewell Junction, NY (US)

(72) Inventors: Amalkumar Ghosh, Hopewell Junction, NY (US); Fridrich Vazan, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 14/615,585

(22) Filed: Feb. 6, 2015

(65) Prior Publication Data

US 2015/0221891 A1 Aug. 6, 2015

Related U.S. Application Data

(60) Provisional application No. 61/936,624, filed on Feb. 6, 2014.

(51) Int. Cl.
| | |
|---|---|
| *H01L 29/04* | (2006.01) |
| *H01L 29/10* | (2006.01) |
| *H01L 31/00* | (2006.01) |
| *H01L 51/52* | (2006.01) |
| *C23C 28/04* | (2006.01) |
| *C23C 28/00* | (2006.01) |

(52) U.S. Cl.
CPC ......... *H01L 51/5256* (2013.01); *C23C 28/04* (2013.01); *C23C 28/42* (2013.01)

(58) Field of Classification Search
CPC .... H01L 51/107; H01L 51/5265; C23C 14/00
USPC .......................... 257/44, 59, 40; 438/82, 482
See application file for complete search history.

(56) References Cited

U.S. PATENT DOCUMENTS

| | | | | |
|---|---|---|---|---|
| 6,518,597 B1* | 2/2003 | Kim | ......................... | G01J 5/12 |
| | | | | 257/415 |
| 7,468,211 B2* | 12/2008 | McCormick | ............ | C23C 14/08 |
| | | | | 428/451 |
| 7,889,284 B1* | 2/2011 | Nemeth | .............. | G02F 1/13338 |
| | | | | 345/173 |
| 9,048,459 B2* | 6/2015 | Cho | .................... | H01L 51/5256 |
| 2002/0003403 A1* | 1/2002 | Ghosh | ................ | H01L 51/5253 |
| | | | | 313/512 |

(Continued)

*Primary Examiner* — Lex Malsawma
*Assistant Examiner* — Eric W Jones
(74) *Attorney, Agent, or Firm* — Kaplan Breyer Schwarz, LLP

(57) ABSTRACT

A high efficacy multi-layer seal structure formed on an organic light emitting diode device and the process for depositing the same. A thin film seal is formed over the substrate having OLED layers, and includes a first metallic layer formed over the substrate, an inorganic layer formed over the first metallic layer, and a second metallic layer formed of the inorganic layer. The metallic layers comprise one or more oxide or nitride layers, each oxide or nitride comprising a metal. The inorganic layer comprises a metal oxide, a metal nitride or a metal oxynitride. The process for forming the multi-layer seal structure includes depositing the first metallic layer over the substrate using atomic layer deposition, depositing the inorganic layer over the first metallic layer using sputtering, and then depositing the second metallic layer over the inorganic layer using atomic layer deposition.

15 Claims, 2 Drawing Sheets

(56) References Cited

U.S. PATENT DOCUMENTS

| | | | |
|---|---|---|---|
| 2002/0172811 A1* | 11/2002 | Barth | B32B 27/08 428/209 |
| 2005/0006768 A1* | 1/2005 | Narasimhan | C23C 14/345 257/751 |
| 2005/0012132 A1* | 1/2005 | Tu | H01L 27/10861 257/306 |
| 2006/0109397 A1* | 5/2006 | Anandan | G02F 1/133603 349/69 |
| 2006/0216548 A1* | 9/2006 | Mao | C23C 16/402 428/701 |
| 2006/0291061 A1* | 12/2006 | Iyama | G02B 5/282 359/614 |
| 2007/0172971 A1* | 7/2007 | Boroson | H01L 51/5246 438/26 |
| 2008/0018244 A1* | 1/2008 | Anandan | H01L 51/5243 313/511 |
| 2009/0091258 A1* | 4/2009 | Heuser | H01L 33/50 313/512 |
| 2009/0151429 A1* | 6/2009 | Jun | G01N 33/0027 73/31.06 |
| 2009/0278131 A1* | 11/2009 | Kwon | H01L 27/1255 257/72 |
| 2010/0187496 A1* | 7/2010 | Yan | H01L 33/32 257/13 |
| 2010/0194941 A1* | 8/2010 | Maehara | H01L 27/14618 348/281 |
| 2010/0244096 A1* | 9/2010 | Sato | H01L 21/02381 257/190 |
| 2011/0049591 A1* | 3/2011 | Nakatani | H01L 27/307 257/292 |
| 2011/0049730 A1* | 3/2011 | Schmid | C23C 16/0272 257/787 |
| 2011/0193067 A1* | 8/2011 | Lee | H01L 51/5256 257/40 |
| 2011/0233693 A1* | 9/2011 | Perruchot | B81B 3/0072 257/417 |
| 2012/0034451 A1* | 2/2012 | Seo | C23C 16/345 428/332 |
| 2012/0248581 A1* | 10/2012 | Sugiyama | H01L 21/76898 257/622 |
| 2013/0003158 A1* | 1/2013 | Gousev | G02B 26/001 359/290 |
| 2013/0140547 A1* | 6/2013 | Lee | H01L 27/3274 257/40 |
| 2013/0334630 A1* | 12/2013 | Kula | H01L 43/02 257/421 |
| 2014/0042426 A1* | 2/2014 | Nishimura | H01L 51/5275 257/40 |
| 2014/0138719 A1* | 5/2014 | Maindron | H01L 51/0017 257/88 |
| 2014/0210836 A1* | 7/2014 | Zhong | G02B 26/0841 345/530 |
| 2014/0249606 A1* | 9/2014 | Pan | H01L 51/0067 607/88 |
| 2014/0264297 A1 | 9/2014 | Kumar et al. | |
| 2014/0306213 A1* | 10/2014 | Sato | H01L 51/5275 257/40 |
| 2015/0357480 A1* | 12/2015 | Yu | H01L 21/02554 257/43 |

\* cited by examiner

HIGH EFFICACY SEAL FOR ORGANIC LIGHT EMITTING DIODE DISPLAYS

CROSS-REFERENCE TO RELATED APPLICATION

This application claims the benefit of provisional patent application Ser. No. 61/936,624 filed in the United States Patent and Trademark Office on Feb. 6, 2014, the entire disclosure of which is incorporated by reference herein.

STATEMENT REGARDING FEDERALLY SPONSORED RESEARCH DEVELOPMENT

Not applicable.

BACKGROUND OF THE INVENTION

Field of the Invention

This invention relates generally to the deposition of thin film materials, and more particularly, a high efficacy multi-layer seal structure formed on an organic light emitting diode (OLED) device and the process for depositing the same.

Description of the Related Art

OLEDs are solid-state devices composed of thin films of organic molecules that create light with the application of electricity. OLED technology is used in commercial applications such as displays for televisions, mobile phones, portable digital media players, computer monitors, car radios, and digital cameras. OLED devices provide brighter, crisper displays on electronic devices and have lower power requirements than conventional light-emitting diodes (LEDs) or liquid crystal displays (LCDs).

An OLED device typically includes a stack of thin layers formed on a substrate. In the stack, a light-emitting layer of a luminescent organic solid, as well as adjacent semiconductor layers, is sandwiched between a cathode and an anode. The light-emitting layer may be selected from any of a multitude of fluorescent organic solids. Any of the layers, and particularly the light-emitting layer, may consist of multiple sublayers.

In a typical OLED, either the cathode or the anode is transparent. The films may be formed by evaporation, spin casting, other appropriate polymer film-forming techniques, or chemical self-assembly. Thicknesses typically range from a few monolayers to about 1 to 2,000 angstroms. OLED devices are extremely sensitive to moisture and susceptible to water damage. Water can instantly damage the organic materials of the displays and significantly shorten the operational lifetime of the device. Therefore, improved sealing processes are important for practical manufacturing.

Currently, protection of OLED against oxygen and moisture can be achieved by encapsulation of the device. The encapsulation can be obtained by means of a single thin-film layer situated on the substrate, surrounding the OLED. Thin film encapsulation is used to prevent moisture in top emitter OLED devices because of their general transparent attributes. There are various methods of thin film encapsulation that exist today. One such approach is to encapsulate the OLED with a multi-layer barrier structure using inorganic and organic layers. Another method disclosed in U.S. patent application Ser. No. 14/203,426, describes a process for encapsulating semiconductors by the deposition of multi-layer barrier structures using organic, inorganic and metallic layers.

Though various layers have been incorporated into the encapsulation structures above, each of these layers have some level of permeability to the environment. As such, the efficacy and reliability of these sealing methods are unfavorable.

Another method for encapsulation involves sandwiching the OLED between two glass panels and sealing the edges. Perimeter epoxy seal is traditionally used with a glass or metal cover provided in the back of the display with a large amount of desiccant. However, this method is only available for bottom emitter OLED devices. In top emitter OLED devices, light is required to travel through the glass cover, and therefore there is no room for the application of desiccant.

While these methods may be suitable for the particular purpose employed, or for general use, they would not be as suitable for the purposes of the present invention as disclosed hereafter.

It is, therefore, a primary object of the present invention to provide a high efficacy seal structure for OLED devices that acts as a moisture barrier.

It is another object of the present invention to provide a seal structure including the process for depositing several layers of transparent inorganic dielectric materials on the OLED device.

It is another object of the present invention to provide a transparent multi-layer seal structure capable of being used with top emitter OLED devices.

It is another object of the present invention to provide a multi-layer seal structure capable of being repeated several times to form a thicker transparent seal.

It is another object of the present invention to provide an improved method for depositing a multi-layer seal structure on an OLED using ALD and sputtering techniques.

BRIEF SUMMARY OF THE INVENTION

In accordance with one aspect of the present invention, a multi-layer seal structure is provided. The structure includes a substrate having organic light emitting diode layers. A first ALD layer is formed over the substrate comprising one or more oxide or nitride layers, each oxide or nitride comprises a metal, wherein the metal for each oxide or nitride layer is independently selected from the group consisting of Al, Hf, Ti, Zr or Si. An inorganic layer is formed over the first ALD layer and comprises a metal oxide, a metal nitride or a metal oxynitride. A second ALD layer is formed over the inorganic layer and comprises one or more oxide or nitride layers, each oxide or nitride comprises a metal, wherein the metal for each oxide or nitride layer is independently selected from the group consisting of Al, Hf, Ti, Zr or Si.

At least one ALD layer of the multi-layer seal structure comprises aluminum oxide ($Al_2O_3$). At least one inorganic layer of the multi-layer seal structure comprises silicon dioxide ($SiO_2$).

The multi-layer seal may be stress compensated.

The multi-layer seal may further include a third ALD layer formed over the second ALD layer comprising one or more oxide or nitride layers, each oxide or nitride comprising a metal, wherein the metal for each oxide or nitride layer is independently selected from the group consisting of Al, Hf, Ti, Zr or Si. The multi-layer seal structure may further include a second inorganic layer formed over the third ALD layer and comprising a metal oxide, a metal nitride or a metal oxynitride. The multi-layer seal structure may further include a fourth ALD layer formed over the inorganic layer comprising one or more oxide or nitride layers, each oxide or nitride comprising a metal, wherein the metal for each oxide or nitride layer is independently selected from the group consisting of Al, Hf, Ti, Zr or Si.

In accordance with an additional embodiment a multi-layer seal structure is provided having a substrate having organic light emitting diode layers. A first ALD layer is formed over the substrate and comprises one or more oxide or nitride layers, each oxide or nitride comprising a metal, wherein the metal for each oxide or nitride layer is independently selected from the group consisting of Al, Hf, Ti, Zr or Si. A first inorganic layer is formed over the first ALD layer and comprises a metal oxide, a metal nitride or a metal oxynitride. A second ALD layer is formed over the inorganic layer and comprises one or more oxide or nitride layers, each oxide or nitride comprising a metal, wherein the metal for each oxide or nitride layer is independently selected from the group consisting of Al, Hf, Ti, Zr or Si. A third ALD layer is formed over the second ALD layer and compriss one or more oxide or nitride layers, each oxide or nitride comprising a metal, wherein the metal for each oxide or nitride layer is independently selected from the group consisting of Al, Hf, Ti, Zr or Si. A second inorganic layer is formed over the third ALD layer and comprises a metal oxide, a metal nitride or a metal oxynitride. A fourth ALD layer is formed over the inorganic layer and comprises one or more oxide or nitride layers, each oxide or nitride comprising a metal, wherein the metal for each oxide or nitride layer is independently selected from the group consisting of Al, Hf, Ti, Zr or Si.

At least one inorganic layer of the multi-layer seal structure comprises silicon dioxide ($SiO_2$).

The multi-layer seal structure may further comprise a fifth ALD layer formed over the fourth ALD layer comprising one or more oxide or nitride layers, each oxide or nitride comprising a metal, wherein the metal for each oxide or nitride layer is independently selected from the group consisting of Al, Hf, Ti, Zr or Si. The multi-layer seal structure may further comprise a third inorganic layer formed over the fourth ALD layer and comprising a metal oxide, a metal nitride or a metal oxynitride. The multi-layer seal structure may further comprise a sixth ALD layer formed over the third inorganic layer comprising one or more oxide or nitride layers, each oxide or nitride comprising a metal, wherein the metal for each oxide or nitride layer is independently selected from the group consisting of Al, Hf, Ti, Zr or Si.

In accordance with an additional embodiment, a method of depositing a multi-layer seal structure is provided. The method includes forming organic light emitting diode layers over a substrate. The method further includes depositing a first metallic layer comprising one or more metal oxide or metal nitride layers over the substrate by atomic layer deposition, each of the metal oxide or metal nitride layers comprises a metal, wherein the metal for each oxide or nitride layer is selected from the group consisting of Al, Hf, Ti, Zr or Si or combinations thereof. The method further includes depositing a first inorganic layer comprising a metal oxide, metal nitride or metal oxynitride over the first metallic layer by sputtering. The method further includes depositing a second metallic layer comprising one or more metal oxide or metal nitride layers over the first inorganic layer by atomic layer deposition, each of the metal oxide or metal nitride layers comprises a metal, wherein the metal for each oxide or nitride layer is selected from the group consisting of Al, Hf, Ti, Zr or Si or combinations thereof.

The method may further include stress compensating the multi-layer seal structure.

The method may further include forming a thicker seal by depositing a third metallic layer comprising one or more metal oxide or metal nitride layers over the second metallic layer by atomic layer deposition, each of the metal oxide or metal nitride layers comprises a metal, wherein the metal for each oxide or nitride layer is selected from the group consisting of Al, Hf, Ti, Zr or Si or combinations thereof. The method may further include depositing a second inorganic layer comprising a metal oxide, metal nitride or metal oxynitride over the third metallic layer by sputtering. The method may further include depositing a fourth metallic layer comprising one or more metal oxide or metal nitride layers over the second inorganic layer by atomic layer deposition second, each of the metal oxide or metal nitride layers comprises a metal, wherein the metal for each oxide or nitride layer is selected from the group consisting of Al, Hf, Ti, Zr or Si or combinations thereof. The method may further include forming a thicker seal by repeating the above steps.

The metallic layers of the method may include at least one layer of aluminum oxide ($Al_2O_3$). The inorganic layers of the method may include at least one layer of silicon dioxide ($SiO_2$).

In accordance with an additional embodiment, a system for depositing a multi-layer seal structure over an organic semiconductor device is provided. The system includes means for depositing a first metallic layer over the organic semiconductor device, wherein the metallic layer comprises one or more metal oxide or metal nitride layers. The system further includes means for depositing a first inorganic layer over the first metallic layer, wherein the inorganic layer comprises a metal oxide, metal nitride or metal oxynitride. The system further includes means for depositing a second metallic layer over the inorganic layer, wherein the second metallic layer comprises one or more metal oxide or metal nitride layers.

The means for depositing the first and second metallic layer is atomic layer deposition. The means for depositing the inorganic layer is sputtering.

BRIEF DESCRIPTION OF THE SEVERAL VIEWS OF THE DRAWINGS

To these and to such other objects that may hereinafter appear, the present invention relates to a high efficacy multi-layer seal structure formed on an organic light emitting diode device and the process for depositing the same as described in detail in the following specification and recited in the annexed claims, taken together with the accompanying drawings, in which like numerals refer to like parts in which:

To the accomplishment of the above and related objects the invention may be embodied in the form illustrated in the accompanying drawings. Attention is called to the fact, however, that the drawings are illustrative only. Variations are contemplated as being part of the invention, limited only by the scope of the claims.

DETAILED DESCRIPTION OF THE INVENTION

A high efficacy seal structure formed on an organic light emitting diode (OLED) device and the process for depositing the same is described herein. In its broadest context, the structure is composed of a multi-layer seal, including an inorganic layer sandwiched between two metallic layers, formed over a substrate. The multi-layer seal can be repeated several times to form a thicker seal. The unique combination of metallic and the inorganic layers creates a very low rate of transmission of moisture through the structure.

Figure 1:
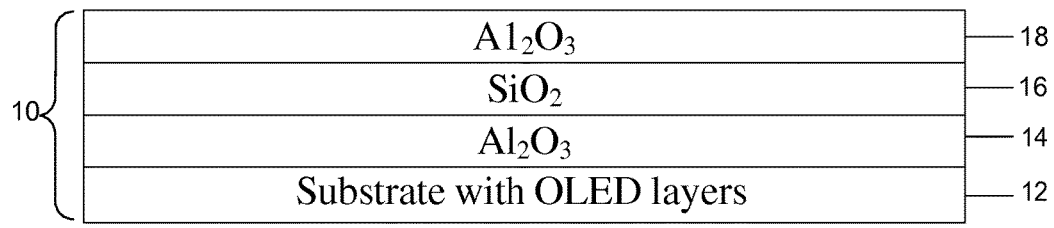
FIG. 1 is cross-sectional view of an OLED device having a multi-layer seal structure deposited over a substrate in accordance with the preferred embodiment of the present invention.

FIG. 1 illustrates the preferred multi-layer structure 10 of the present invention. The structure 10 includes a substrate 12 having OLED layers 12 thereon. Preferably, the substrate includes an exposed surface for depositing the OLED layers thereon. The multi-layer seal is formed over the substrate. Preferably, the seal includes three layers including a first metallic layer 14 formed over the substrate 12, an inorganic layer 16 formed over the first metallic layer 14, and a second metallic layer 18 formed of the inorganic layer 14. The metallic layers 14, 18 comprise one or metal oxide or metal nitride layers. Preferably, the metal for each oxide or nitride layer is selected from the group consisting of aluminum (Al), hafnium (Hf), titanium (Ti), zirconium (Zr), silicon (Si), or combinations thereof.

In the preferred embodiment, the metallic layers 14, are composed of aluminum oxide ($Al_2O_3$) deposited by atomic layer deposition (ALD). This highly conformal coating seals most of the particles that maybe present on the surface of the OLED and typically has tensile stress. The metallic layers 14, 16 can be substituted by other materials that are compatible with the ALD process.

The inorganic layer 16 is deposited over the first metal layer 14 by a sputtering process. The inorganic layer 16 is composed of a metal oxide, a metal nitride or a metal oxynitride. In the preferred embodiment, the inorganic layer 16 is composed of silicon dioxide ($SiO_2$). Though this is an inorganic layer it can also be termed metallic as it contains a compound, silicon (Si), which is a metalloid (that is, a chemical element with properties in between, or that are a mixture of, those of metals and nonmetals). This second inorganic layer 16 is denser than the true metallic layers 14, 18 and has a compressive stress. This sputtered inorganic layer 16 may also be substituted by other materials that are compatible with the sputter process.

The sputtered inorganic layer 16 may have a larger number of pinholes compared to the first metallic layer 14. As such, the second metallic layer 18 is deposited over the inorganic layer 16 by ALD for covering pinholes present in the inorganic layer 16.

The first metallic layer 14 is a highly conformal coating and seals most of the particles that may be present on the surface of the OLED. This layer has tensile stress thus creating flexibility in the OLED. The first inorganic layer 16 has a compressive stress that further helps seal or embed the particles. As such this inorganic layer 16 acts as a secondary sealant which improves the impermeability of the seal structure. The second metallic layer 18 acts as tertiary sealant, further covering any pinholes left exposed after the inorganic layer 16 is deposited. All of the layers of the seal are transparent, inorganic and dielectric in nature, which collectively create a high quality seal structure for an OLED device.

Figure 2:
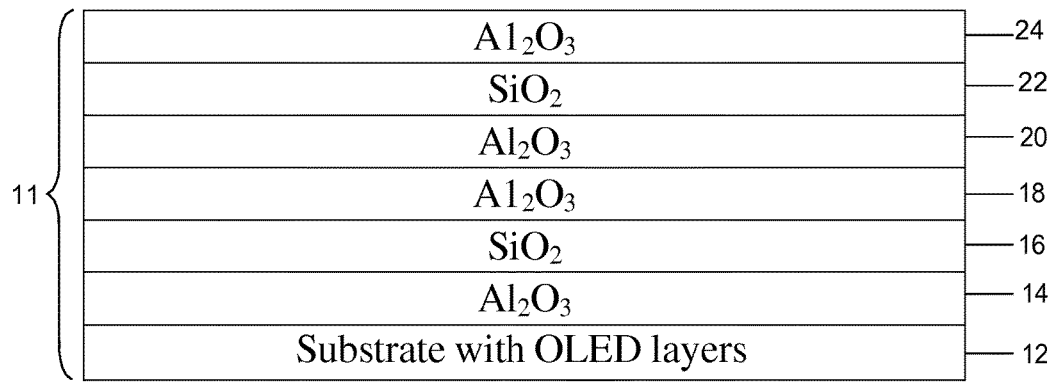
FIG. 2 is cross-sectional view of an OLED device having a multi-layer seal structure deposited over a substrate in accordance with an additional embodiment of the present invention.

FIG. 2 illustrates an alternate embodiment having a thicker multi-layer seal 11. The thicker seal 11 includes a second inorganic layer 22, sandwiched between third and fourth metallic layers 20, 24 deposited above the second metallic layer 18. The metallic layers 20, 24 comprise one or more metal oxide or metal nitride layers. Preferably, the metal for each oxide or nitride layer is selected from the group consisting of aluminum (Al), hafnium (Hf), titanium (Ti), zirconium (Zr), silicon (Si), or combinations thereof. Preferably, the metallic layers 20, are composed of aluminum oxide ($Al_2O_3$) deposited by atomic layer deposition (ALD). The inorganic layer 22 is deposited over the second metal layer 18 by a sputtering process. The inorganic layer 22 is composed of a metal oxide, a metal nitride or a metal oxynitride. In the preferred embodiment, the inorganic layer 22 is composed of silicon dioxide ($SiO_2$).

Figure 3:
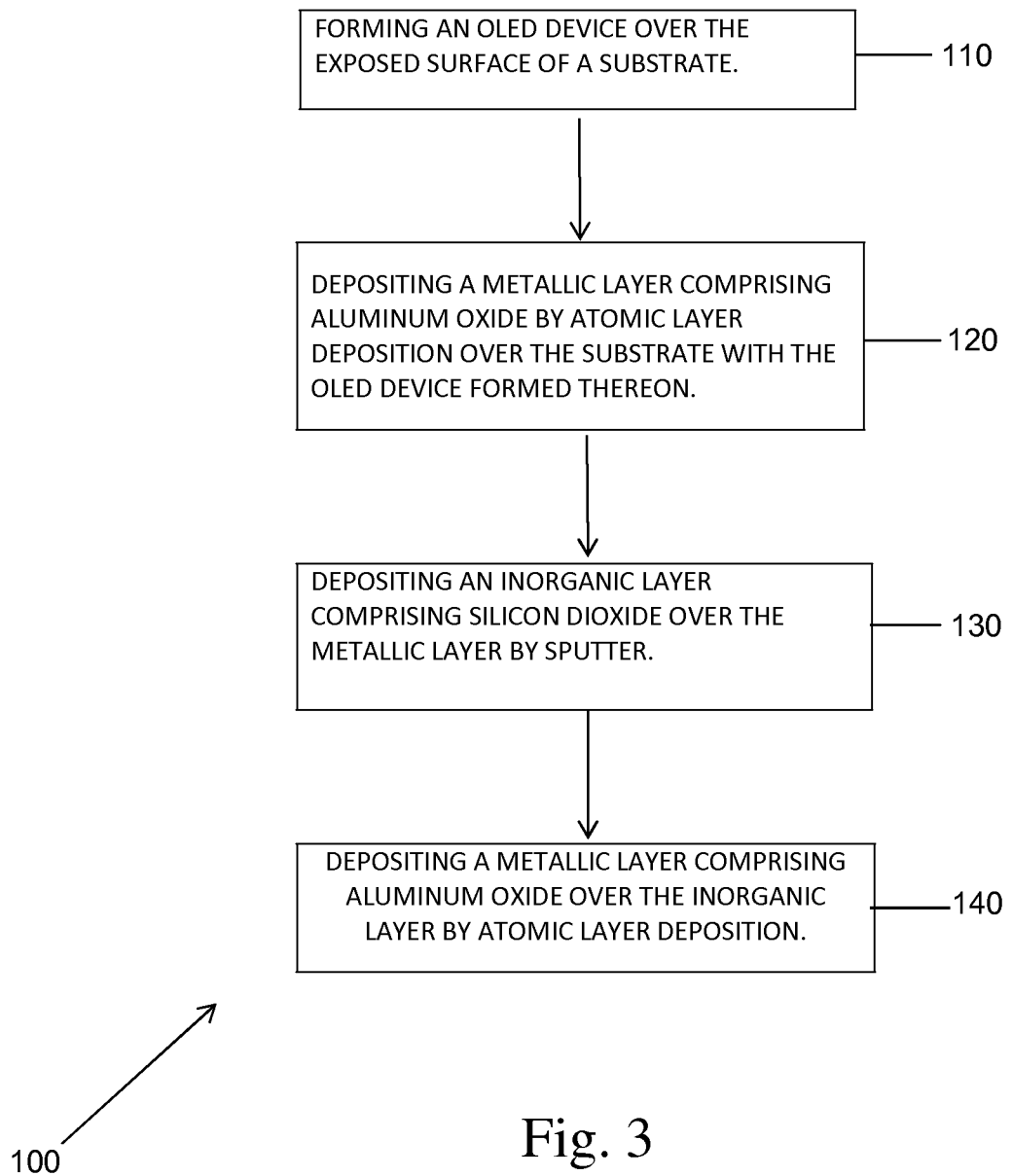
FIG. 3 is a flow diagram illustrating a method of forming the multi-layer seal structure on a substrate in accordance with the preferred embodiment of the present invention shown in FIG. 1.

FIG. 3 is a flow diagram depicting a method of forming the multi-layer seal structure 10 on the substrate 12 in accordance with the preferred embodiment of the present invention. The method 100 begins with the first step 110, wherein the OLED device is formed over the exposed surface of the substrate layer 12. In one embodiment, the OLED structure comprises at least the hole-transport layer and the emissive layer along with the anode layer and the cathode layer. However, the OLED structure can comprise functional equivalents as well.

The second step 120 includes depositing by ALD the first metallic layer 14 comprising aluminum oxide ($Al_2O_3$), a metal oxide, over the substrate layer 12. A variety of layers deposited by ALD can function as the metallic layer, so long as the deposition is defect free. This metallic layer is highly conformal and flexible and seals most of the particles present on the surface of the OLED.

The third step 130 includes depositing by sputtering the first inorganic layer 16 comprising silicon dioxide ($SiO_2$) over the first metallic layer 14. The first inorganic layer 16 provides compression and further helps seal or embed particles to strengthen impermeability of the structure. A variety of layers deposited by sputter can function as this inorganic layer, so long as the chemical is compatible with the sputter process.

The fourth step 140 includes depositing by ALD the second metallic layer 18 comprising aluminum oxide ($Al_2O_3$), a metal oxide, over the first inorganic layer 16. A variety of layers deposited by ALD can function as the metallic layer. The second metallic layer 18 serves to further seal any pinholes that might be present after the first inorganic layer 16 is deposited using sputter.

In other embodiments, the second, third, and fourth steps, 120, 130 and 140 are repeated to form a thicker seal. These steps may be repeated several times to form a seal of desired thickness. In particular, the third metallic layer 20 is then deposited over the second metallic layer 18 by ALD. The second inorganic layer 22 is then formed over the third metallic layer 20 by sputtering. Then, the fourth metallic layer is deposited over the second inorganic layer 22 by ALD.

It should be understood that numerous variations are possible, while adhering to the inventive concept. Such variations are contemplated as being a part of the present invention.

While only one preferred embodiment of the present invention has been disclosed for purposes of illustration, it is obvious that many modifications and variations could be made thereto. It is intended to cover all of those modifications and variations, which fall within the scope of the present invention as defined by the following claims.

We claim:

1. A multi-layer seal, comprising:
   a substrate having organic light emitting diode layers;
   a first ALD (atomic layer deposition) layer formed over the substrate and comprising one or more oxide or nitride layers, each oxide or nitride comprising a metal, wherein the metal for each oxide or nitride layer is selected from the group consisting of Al, Hf, Ti, Zr or Si;
   a first non-ALD layer formed over the first ALD layer and comprising a metal oxide, a metal nitride or a metal oxynitride; and
   a second ALD layer formed over the first non-ALD layer and comprising one or more oxide or nitride layers, each oxide or nitride comprising a metal, wherein the metal for each oxide or nitride layer is selected from the group consisting of Al, Hf, Ti, Zr or Si.

2. The multi-layer seal structure of claim 1, wherein at least one ALD layer comprises aluminum oxide ($Al_2O_3$).

3. The multi-layer seal structure of claim 1, wherein the first non-ALD comprises silicon dioxide ($SiO_2$).

4. The multi-layer seal structure of claim 1 further comprising a second non-ALD layer formed over the second ALD Layer and comprising a metal oxide, a metal nitride or a metal oxynitride.

5. The multi-layer seal structure of claim 4 further comprising a third ALD layer formed over the second non-ALD layer comprising one or more oxide or nitride layers, each oxide or nitride comprising a metal, wherein the metal for each oxide or nitride layer is selected from the group consisting of Al, Hf, Ti, Zr or Si.

6. A multi-layer seal structure, comprising:
   a substrate having organic light emitting diode layers;
   a first ALD (atomic layer deposition)layer formed over the substrate comprising one or more oxide or nitride layers, each oxide or nitride comprising a metal, wherein the metal for each oxide or nitride layer is selected from the group consisting of Al, Hf, Ti, Zr or Si;
   a first non-ALD layer formed over the first ALD layer and comprising a metal oxide, a metal nitride or a metal oxynitride;
   a second ALD layer formed over the first non-ALD layer comprising one or more oxide or nitride layers, each oxide or nitride comprising a metal, wherein the metal for each oxide or nitride layer is selected from the group consisting of Al, Hf, Ti, Zr or Si;
   a second non-ALD layer formed over the second ALD layer comprising a metal oxide, a metal nitride or a metal oxynitride; and
   a third ALD layer formed over the second non-ALD layer comprising one or more oxide or nitride layers, each oxide or nitride comprising a metal, wherein the metal for each oxide or nitride layer is selected from the group consisting of Al, Hf, Ti, Zr or Si.

7. The multi-layer seal structure of claim 6, wherein at least one non-ALD layer comprises silicon dioxide ($SiO_2$).

8. The multi-layer seal structure of claim 6, further comprising a third non-ALD layer formed over the third ALD layer and comprising a metal oxide, a metal nitride or a metal oxynitride.

9. The multi-layer seal structure of claim 8, further comprising a fourth ALD layer formed over the third non-ALD layer comprising one or more oxide or nitride layers, each oxide or nitride comprising a metal, wherein the metal for each oxide or nitride layer is selected from the group consisting of Al, Hf, Ti, Zr or Si.

10. A method of depositing a multi-layer seal, comprising:
    forming organic light emitting diode layers over a substrate;
    depositing a first layer comprising one or more metal oxide or metal nitride layers over the substrate by atomic layer deposition (ALD), each of the metal oxide or metal nitride layers comprises a metal, wherein the metal for each oxide or nitride layer is selected from the group consisting of Al, Hf, Ti, Zr or Si or combinations thereof;
    depositing a first inorganic layer comprising a metal oxide, metal nitride or metal oxynitride over the first layer, wherein the first inorganic layer is deposited using a process other than atomic layer deposition;and
    depositing a second layer comprising one or more metal oxide or metal nitride layers over the first inorganic layer by atomic layer deposition, each of the metal oxide or metal nitride layers comprises a metal, wherein the metal for each oxide or nitride layer is selected from the group consisting of Al, Hf, Ti, Zr or Si or combinations thereof.

11. The method of claim 10, further comprising forming a thicker seal, the steps comprising:
    depositing a second inorganic layer comprising a metal oxide,metal nitride or metal oxynitride over the second layer using a deposition process other than atomic layer deposition; and
    depositing a third layer comprising one or more metal oxide or metal nitride layers over the second inorganic layer by atomic layer deposition,each of the metal oxide or metal nitride layers comprises a metal, wherein the metal for each oxide or nitride layer is selected from the group consisting of Al, Hf, Ti, Zr or Si or combinations thereof.

12. The method of claim 11, wherein the steps are repeated to form a thicker seal.

13. The method of claim 10, wherein at least one of the first and second layers comprises at least one layer of aluminum oxide ($Al_2O_3$).

14. The method of claim 10, wherein the first inorganic layers comprise at least one layer of silicon dioxide ($SiO_2$).

15. The system of depositing a multi-layer seal of claim 10, wherein the process for depositing the first inorganic layer over the first layer is selected from a group consisting of sputtering, electroplating, vapor deposition, and evaporation.

* * * * *